United States Patent
Beardsworth et al.

(10) Patent No.: US 11,595,037 B2
(45) Date of Patent: Feb. 28, 2023

(54) COMPENSATION FOR AIR GAP CHANGES AND TEMPERATURE CHANGES IN A RESONANT PHASE DETECTOR

(71) Applicant: Cirrus Logic International Semiconductor Ltd., Edinburgh (GB)

(72) Inventors: Matthew Beardsworth, Austin, TX (US); Tejasvi Das, Austin, TX (US); Siddharth Maru, Austin, TX (US); Luke Lapointe, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 17/848,051

(22) Filed: Jun. 23, 2022

(65) Prior Publication Data

US 2022/0337235 A1    Oct. 20, 2022

Related U.S. Application Data

(63) Continuation of application No. 17/494,479, filed on Oct. 5, 2021, now Pat. No. 11,418,184, which is a continuation of application No. 16/654,791, filed on Oct. 16, 2019, now Pat. No. 11,171,641.

(60) Provisional application No. 62/856,393, filed on Jun. 3, 2019.

(51) Int. Cl.
  *H03K 17/97*  (2006.01)
  *H03K 17/14*  (2006.01)
  *H03K 17/975* (2006.01)

(52) U.S. Cl.
  CPC ............. *H03K 17/14* (2013.01); *H03K 17/97* (2013.01); *H03K 17/975* (2013.01)

(58) Field of Classification Search
  None
  See application file for complete search history.

(56) References Cited

U.S. PATENT DOCUMENTS

| 4,888,554 A | 12/1989 | Hyde et al. |
| 8,144,126 B2 | 3/2012 | Wright |
| 8,674,950 B2 | 3/2014 | Olson |
| 8,970,230 B2 | 3/2015 | Narayanasamy et al. |

(Continued)

FOREIGN PATENT DOCUMENTS

| CH | 702140 A2 | 5/2011 |
| DE | 4004450 A1 | 8/1991 |
| GB | 2204692 A | 11/1988 |

OTHER PUBLICATIONS

International Search Report and Written Opinion of the International Searching Authority, International Application No. PCT/US2020/034520, dated Aug. 13, 2020.

*Primary Examiner* — Thomas J. Hiltunen
*Assistant Examiner* — Khareem E Almo
(74) *Attorney, Agent, or Firm* — Jackson Walker L.L.P.

(57) ABSTRACT

A system may include a sensor configured to output a sensor signal indicative of a distance between the sensor and a mechanical member associated with the sensor, a measurement circuit communicatively coupled to the sensor and configured to determine a physical force interaction with the mechanical member based on the sensor signal, and a compensator configured to monitor the sensor signal and to apply a compensation factor to the sensor signal to compensate for changes to properties of the sensor based on at least one of changes in a distance between the sensor and the mechanical member and changes in a temperature associated with the sensor.

26 Claims, 6 Drawing Sheets

(56) References Cited

U.S. PATENT DOCUMENTS

| | | | |
|---|---|---|---|
| 9,479,134 B2* | 10/2016 | Reitsma | H03H 2/005 |
| 10,454,171 B2* | 10/2019 | Choi | H01Q 7/00 |
| 10,624,691 B2 | 4/2020 | Wiener et al. | |
| 11,092,657 B2 | 8/2021 | Maru et al. | |
| 11,226,211 B2* | 1/2022 | Mullenix | G01D 5/2225 |
| 2005/0283330 A1 | 12/2005 | Laraia et al. | |
| 2007/0268265 A1 | 11/2007 | XiaoPing | |
| 2007/0296709 A1 | 12/2007 | GuangHai | |
| 2008/0024456 A1 | 1/2008 | Peng et al. | |
| 2008/0088594 A1 | 4/2008 | Liu et al. | |
| 2008/0088595 A1 | 4/2008 | Liu et al. | |
| 2008/0007534 A1 | 6/2008 | Peng et al. | |
| 2008/0142352 A1 | 6/2008 | Wright | |
| 2008/0143681 A1 | 6/2008 | XiaoPing | |
| 2008/0150905 A1 | 6/2008 | Grivna et al. | |
| 2009/0302868 A1 | 12/2009 | Feucht et al. | |
| 2010/0225332 A1 | 9/2010 | Niwa et al. | |
| 2010/0231239 A1 | 9/2010 | Tateishi et al. | |
| 2011/0005090 A1 | 1/2011 | Lee et al. | |
| 2016/0169717 A1* | 6/2016 | Zhitomirsky | G01D 5/142 |
| | | | 702/94 |
| 2016/0252403 A1 | 9/2016 | Murakami | |
| 2017/0185173 A1 | 6/2017 | Ito et al. | |
| 2017/0237293 A1 | 8/2017 | Faraone et al. | |
| 2018/0019722 A1 | 1/2018 | Birkbeck | |
| 2018/0260049 A1 | 9/2018 | O'Lionaird et al. | |
| 2019/0302193 A1 | 10/2019 | Maru et al. | |
| 2019/0326906 A1 | 10/2019 | Camacho Cardenas et al. | |
| 2020/0320966 A1 | 10/2020 | Clark et al. | |
| 2020/0373923 A1 | 11/2020 | Walsh et al. | |
| 2020/0382113 A1* | 12/2020 | Beardsworth | G01D 18/008 |

\* cited by examiner

COMPENSATION FOR AIR GAP CHANGES AND TEMPERATURE CHANGES IN A RESONANT PHASE DETECTOR

RELATED APPLICATIONS

The present disclosure is a continuation of U.S. Non-Provisional patent application Ser. No. 17/494,479, filed Oct. 5, 2021, which is a continuation of U.S. Non-Provisional patent application Ser. No. 16/654,791, filed Oct. 16, 2019, issued as U.S. Pat. No. 11,171,641 on Nov. 9, 2021, which claims priority to U.S. Provisional Patent Application Ser. No. 62/856,393, filed Jun. 3, 2019, each which is incorporated by reference herein in its entirety.

FIELD OF DISCLOSURE

The present disclosure relates in general to electronic devices with user interfaces, (e.g., mobile devices, game controllers, instrument panels for vehicles, machinery, and/or appliances, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices that are waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a sensor configured to output a sensor signal indicative of a distance between the sensor and a mechanical member associated with the sensor, a measurement circuit communicatively coupled to the sensor and configured to determine a physical force interaction with the mechanical member based on the sensor signal, and a compensator configured to monitor the sensor signal and to apply a compensation factor to the sensor signal to compensate for changes to properties of the sensor based on at least one of changes in a distance between the sensor and the mechanical member and changes in a temperature associated with the sensor.

In accordance with embodiments of the present disclosure, a method may include, in a system comprising a sensor configured to output a sensor signal indicative of a distance between the sensor and a mechanical member associated with the sensor and a measurement circuit communicatively coupled to the sensor and configured to determine a physical force interaction with the mechanical member based on the sensor signal, monitoring the sensor signal and applying a compensation factor to the sensor signal to compensate for changes to properties of the sensor based on at least one of changes in a distance between the sensor and the mechanical member and changes in a temperature associated with the sensor.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 illustrates selected components of an example resistive-inductive-capacitive sensor, in accordance with embodiments of the present disclosure; Each of FIGS. 5A-5C illustrates a diagram of selected components of an example resonant phase sensing system, in accordance with embodiments of the present disclosure;

DETAILED DESCRIPTION

Figure 1:
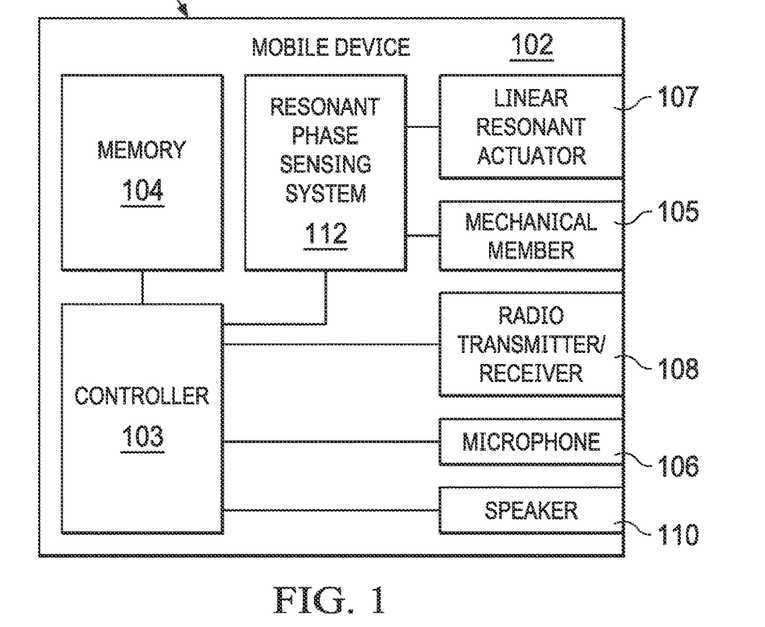
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sensing system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Although the foregoing contemplates a resonant phase sensing system 112 for use in a mobile device 102, the resonant phase sensing system 112 may be used in any other suitable host device. A host device may include without limitation, a portable and/or battery-powered mobile computing device (e.g., a laptop, notebook, or tablet computer), a gaming console, a remote control device, a home automation controller, a domestic appliance (e.g., domestic temperature or lighting control system), a toy, a machine (e.g., a robot), an audio player, a video player, and a mobile telephone (e.g., a smartphone).

Figure 2:
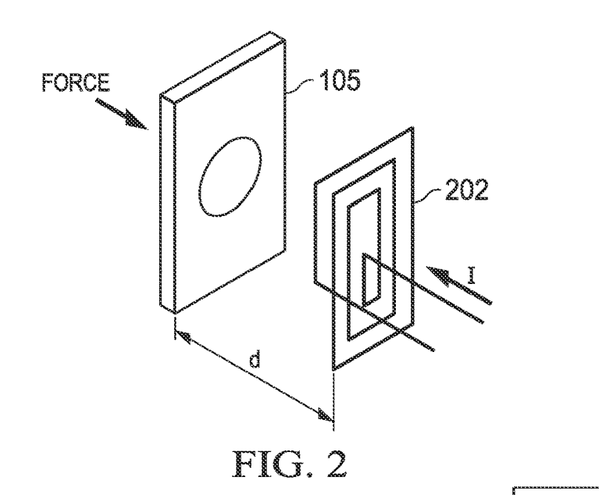
FIG. 2 illustrates a mechanical member separated by a distance from an inductive coil, in accordance with embodiments of the present disclosure.
Figure 3:
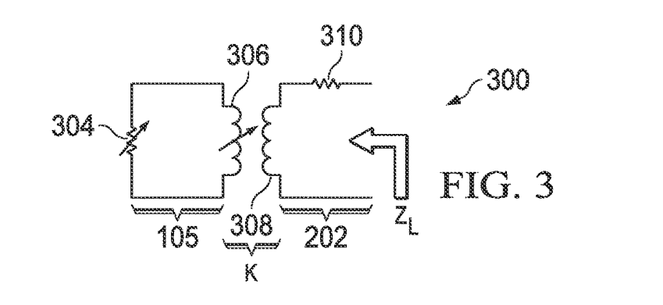
FIG. 3 illustrates selected components of a model for a mechanical member and inductive coil that may be used in an inductive sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of a model for mechanical member 105 and inductive coil 202 that may be used in an inductive sensing system 300, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

Figures 4, 5A:
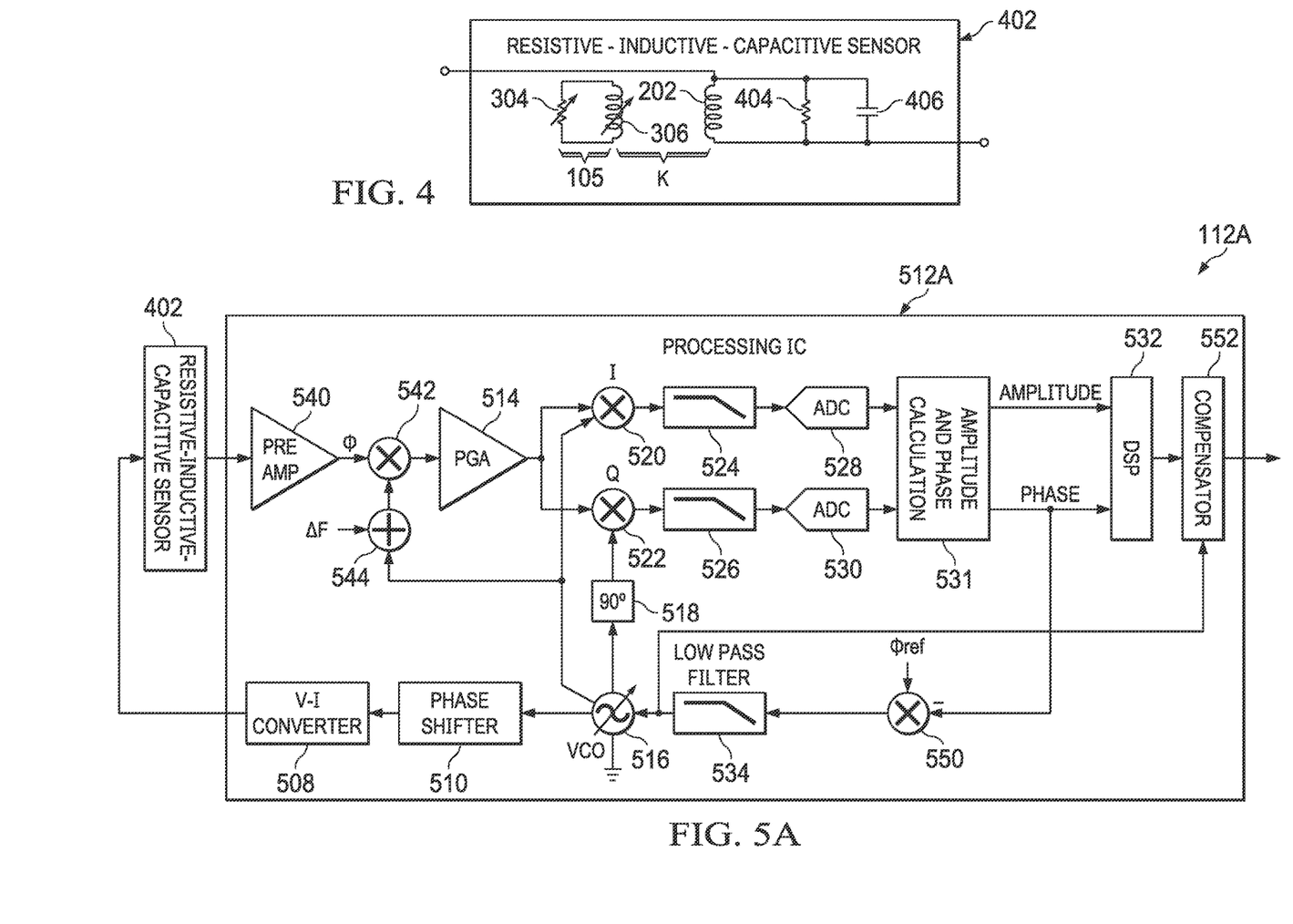

FIG. 4 illustrates selected components of an example resistive-inductive-capacitive sensor 402, in accordance with embodiments of the present disclosure. As shown in FIG. 4, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4 to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

FIG. 5A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown FIG. 5A, resonant phase sensing system 112A may include a resistive-inductive-capacitive sensor 402 and a processing integrated circuit (IC) 512A.

Processing IC 512A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistiveinductive-capacitive sensor 402. Thus, processing IC 512A may be configured to determine an occurrence of a physical interaction (e.g., press or release of a virtual button) associated with a human-machine interface associated with mechanical member 105 based on the phase information.

As shown in FIG. 5A, processing IC 512A may include a phase shifter 510, a voltage-to-current (V-I) converter 508, a preamplifier 540, an intermediate frequency mixer 542, a combiner 544, a programmable gain amplifier (PGA) 514, an oscillator 516, a phase shifter 518, an amplitude and phase calculation block 531, a DSP 532, a low-pass filter 534, a combiner 550, and a compensator 552. Processing IC 512A may also include a coherent incident/quadrature detector implemented with an incident channel comprising a mixer 520, a low-pass filter 524, and an analog-to-digital converter (ADC) 528, and a quadrature channel comprising a mixer 522, a low-pass filter 526, and an ADC 530 such that processing IC 512A is configured to measure the phase information using the coherent incident/quadrature detector.

Phase shifter 510 may include any system, device, or apparatus configured to receive an oscillation signal generated by processing IC 512A (as explained in greater detail below) and phase shift such oscillation signal such that at an operating frequency of resonant phase sensing system 112, an incident component of a sensor signal ϕ generated by pre-amplifier 540 is approximately equal to a quadrature component of sensor signal ϕ, so as to provide common mode noise rejection by a phase detector implemented by processing IC 512A, as described in greater detail below.

V-I converter 508 may receive the phase shifted oscillation signal from phase shifter 510, which may be a voltage signal, convert the voltage signal to a corresponding current signal, and drive the current signal on resistive-inductive-capacitive sensor 402 at a driving frequency with the phase-shifted oscillation signal in order to generate sensor signal ϕ which may be processed by processing IC 512A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 540 may receive sensor signal ϕ and condition sensor signal ϕ for frequency mixing, with mixer 542, to an intermediate frequency Δf combined by combiner 544 with an oscillation frequency generated by oscillator 516, as described in greater detail below, wherein intermediate frequency Δf is significantly less than the oscillation frequency. In some embodiments, preamplifier 540, mixer 542, and combiner 544 may not be present, in which case PGA 514 may receive sensor signal ϕ directly from resistive-inductive-capacitive sensor 402. However, when present, preamplifier 540, mixer 542, and combiner 544 may allow for mixing sensor signal ϕ down to a lower intermediate frequency Δf which may allow for lower-bandwidth and more efficient ADCs (e.g., ADCs 528 and 530 of FIGS. 5A and 5B and ADC 529 of FIG. 5C, described below) and/or which may allow for minimization of phase and/or gain mismatches in the incident and quadrature paths of the phase detector of processing IC 512A.

In operation, PGA 514 may further amplify sensor signal ϕ to condition sensor signal ϕ for processing by the coherent incident/quadrature detector. Oscillator 516 may generate an oscillation signal to be used as a basis for the signal driven by V-I converter 508, as well as the oscillation signals used by mixers 520 and 522 to extract incident and quadrature components of amplified sensor signal ϕ. As shown in FIG. 5A, mixer 520 of the incident channel may use an unshifted version of the oscillation signal generated by oscillator 516, while mixer 522 of the quadrature channel may use a 90-degree shifted version of the oscillation signal phase shifted by phase shifter 518. As mentioned above, the oscillation frequency of the oscillation signal generated by oscillator 516 may be selected based on a resonant frequency of resistive-inductive-capacitive sensor 402 (e.g., may be approximately equal to the resonant frequency of resistive-inductive-capacitive sensor 402). In some embodiments, oscillator 516 may be implemented with a voltage-controlled oscillator (VCO). In other embodiments, oscillator 516 may be implemented with a digitally-controlled oscillator (DCO).

In the incident channel, mixer 520 may extract the incident component of amplified sensor signal ϕ, low-pass filter 524 may filter out the oscillation signal mixed with the amplified sensor signal ϕ to generate a direct current (DC) incident component, and ADC 528 may convert such DC incident component into an equivalent incident component digital signal for processing by amplitude and phase calculation block 531. Similarly, in the quadrature channel, mixer 522 may extract the quadrature component of amplified sensor signal ϕ, low-pass filter 526 may filter out the phase-shifted oscillation signal mixed with the amplified sensor signal ϕ to generate a direct current (DC) quadrature component, and ADC 530 may convert such DC quadrature component into an equivalent quadrature component digital signal for processing by amplitude and phase calculation block 531.

Amplitude and phase calculation block 531 may include any system, device, or apparatus configured to receive phase information comprising the incident component digital signal and the quadrature component digital signal and based thereon, extract amplitude and phase information.

DSP 532 may include any system, device, or apparatus configured to interpret and/or execute program instructions and/or process data. In particular, DSP 532 may receive the phase information and the amplitude information generated by amplitude and phase calculation block 531 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 532 may also generate an output signal indicative of the displacement. In some embodiments, such output signal may comprise a control signal for controlling mechanical vibration of linear resonant actuator 107 in response to the displacement.

Compensator 552 may comprise any system, device, or apparatus which may track changes in properties of resistive-inductive-capacitive sensor 402 due to either or both of a change in a gap (e.g., an air gap) between mechanical member 105 and inductive coil 202 and a change in a temperature associated with resistive-inductive-capacitive sensor 402, and which may further apply dynamic compensation such that under changes in such properties, the resonant phase sensing system 112 provides a consistent response indicative of human interaction with a virtual button.

Combiner 550 may subtract the phase information generated by amplitude and phase calculation block 531 from a reference phase $\phi_{ref}$ in order to generate an error signal that may be received by low-pass filter 534. Low-pass filter 534 may low-pass filter the error signal, and such filtered error signal may be applied to oscillator 516 to modify the frequency of the oscillation signal generated by oscillator 516, in order to drive sensor signal ϕ towards reference phase $\phi_{ref}$. As a result, sensor signal ϕ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 534 in connection with oscillator 516 may implement a feedback control loop that may track changes in operating parameters of resonant phase sensing system 112A by modifying the driving frequency of oscillator 516.

Figure 5B:
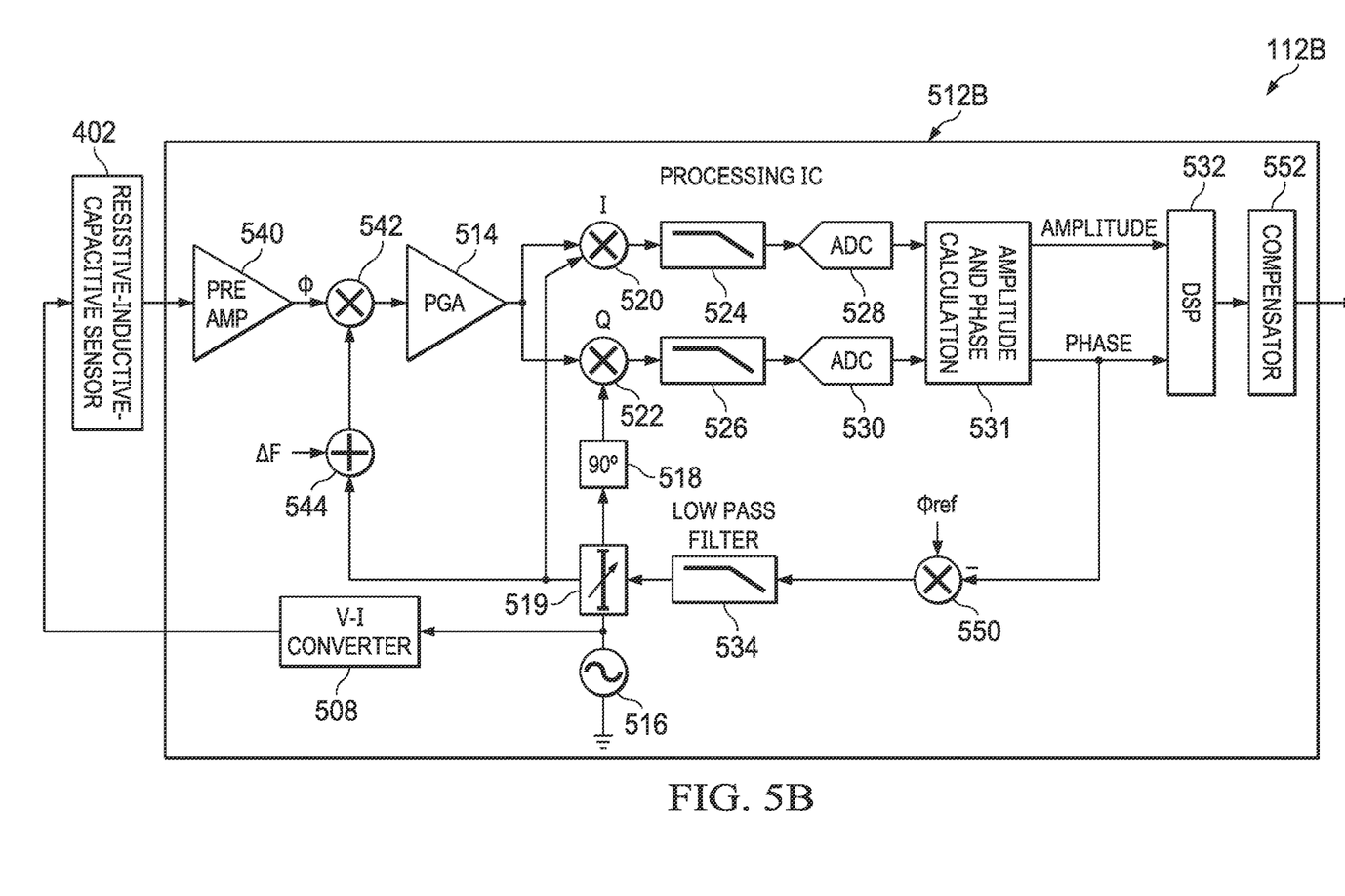

FIG. 5B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 5B may be, in many respects, similar to resonant phase sensing system 112A of FIG. 5A. Accordingly, only those differences between resonant phase sensing system 112B and resonant phase sensing system 112A may be described below. As shown FIG. 5B, resonant phase sensing system 112B may include processing IC 512B in lieu of processing IC 512A. Processing IC 512B of FIG. 5B may be, in many respects, similar to processing IC 512A of FIG. 5A. Accordingly, only those differences between processing IC 512B and processing IC 512A may be described below.

Processing IC 512B may include variable phase shifter 519. Thus, in operation, oscillator 516 may drive a driving signal and oscillation signal which variable phase shifter 519 may phase shift to generate oscillation signals to be mixed by mixers 520 and 522. Similar to that of processing IC 512A, low-pass filter 534 may low-pass filter an error signal based on phase information extracted by amplitude and phase calculation block 531, but instead such filtered error signal may be applied to variable phase shifter 519 to modify the phase offset of the oscillation signal generated by oscillator 516, in order to drive sensor signal ϕ towards indicating a phase shift of zero. As a result, sensor signal ϕ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 534 in connection with variable phase shifter 519 may implement a feedback control loop that may track changes in operating parameters of resonant phase sensing system 112B by modifying the phase shift applied by variable phase shifter 519.

Figure 5C:
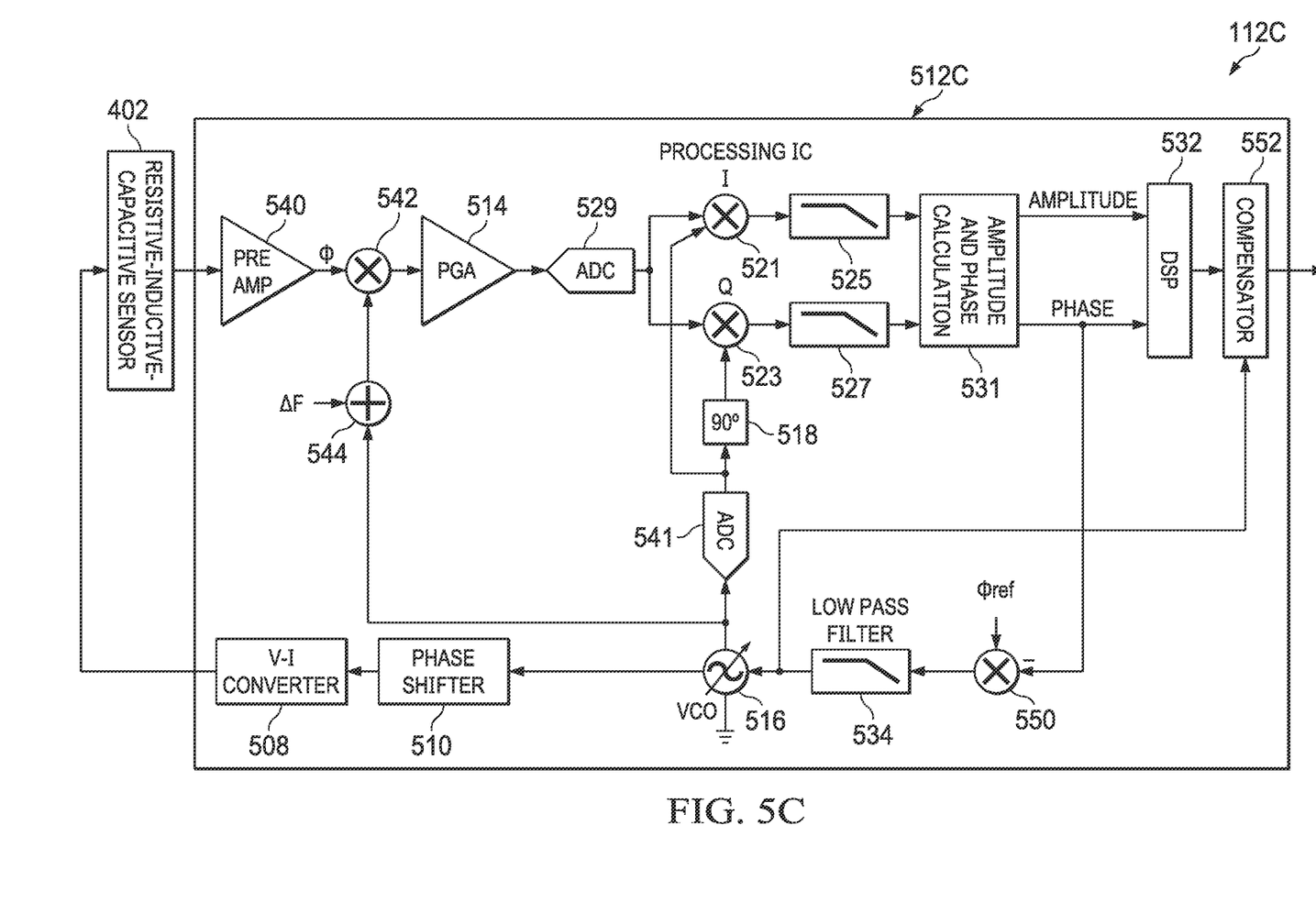

FIG. 5C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 5C may be, in many respects, similar to resonant phase sensing system 112A of FIG. 5A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 529 and ADC 541 in lieu of ADC 528 and ADC 530. Accordingly, a coherent incident/quadrature detector for resonant phase sensing system 112C may be implemented with an incident channel comprising a digital mixer 521 and a digital low-pass filter 525 (in lieu of analog mixer 520 and analog low-pass filter 524) and a quadrature channel comprising a digital mixer 523 and a low-pass filter 527 (in lieu of analog mixer 522 and analog low-pass filter 526) such that processing IC 512C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

Figure 6:
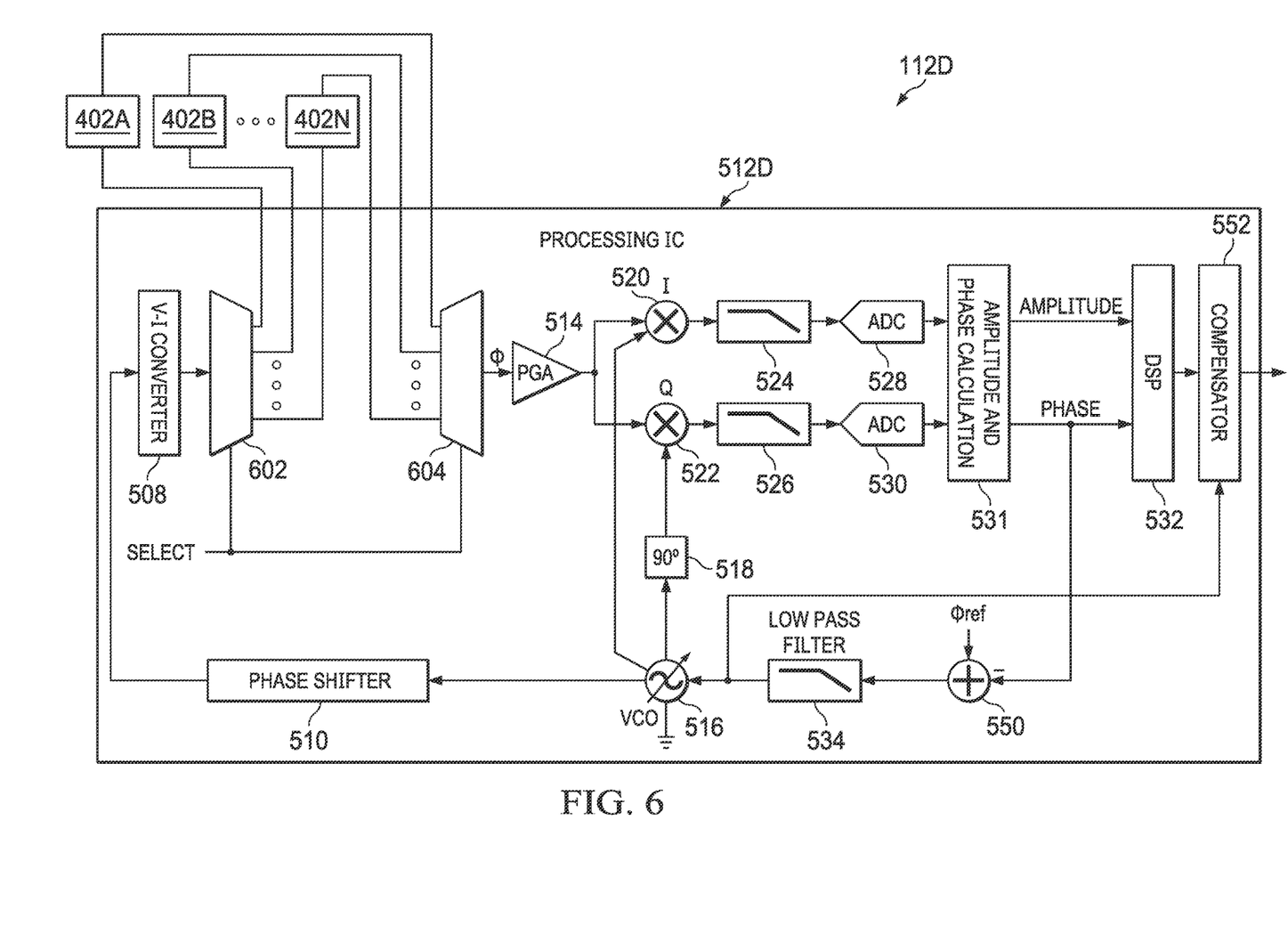
FIG. 6 illustrates a diagram of selected components of an example resonant phase sensing system implementing time-division multiplexed processing of multiple resistive-inductive-capacitive sensors, in accordance with embodiments of the present disclosure.

FIG. 6 illustrates a diagram of selected components of an example resonant phase sensing system 112D implementing time-division multiplexed processing of multiple resistive-inductive-capacitive sensors 402 (e.g., resistive-inductive-capacitive sensors 402A-402N shown in FIG. 6), in accordance with embodiments of the present disclosure. In some embodiments, resonant phase sensing system 112D may be used to implement resonant phase sensing system 112 of FIG. 1. Resonant phase sensing system 112D of FIG. 6 may be, in many respects, similar to resonant phase sensing system 112A of FIG. 5A. Accordingly, only those differences between resonant phase sensing system 112D and resonant phase sensing system 112A may be described below. In particular, resonant phase sensing system 112D may include a plurality of resistive-inductive-capacitive sensors 402 (e.g., resistive-inductive-capacitive sensors 402A-402N shown in FIG. 6) in lieu of the single resistive-inductive-capacitive sensor 402 shown in FIG. 5A. In addition, resonant phase sensing system 112D may include multiplexers 602 and 604, each of which may select an output signal from a plurality of input signals responsive to a control signal SELECT (which may be controlled by a time-division multiplexing control subsystem implemented by controller 103 or another suitable component of mobile device 102). Thus, while in some embodiments a device such as mobile device 102 may comprise a plurality of resistive-inductive-capacitive sensors 402 which may be simultaneously driven and separately processed by a respective processing IC, in other embodiments a resonant phase sensing system (e.g., resonant phase sensing system 112D) may drive resistive-inductive-capacitive sensors 402 in a time-division multiplexed manner Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

For purposes of clarity and exposition, preamplifier 440, mixer 442, and combiner 444 have been excluded from FIG. 6. However, in some embodiments, processing IC 512D may include preamplifier 440, mixer 442, and combiner 444 similar to that depicted in FIGS. 5A-5C.

In resonant phase sensing system 112D, when a first resistive-inductive-capacitive sensor (e.g., resistive-inductive-capacitive sensor 402A) is selected by the time-division multiplexing control subsystem for being driven by V-I converter 508 and measured by the measurement circuit implemented by processing IC 512D, other resistive-inductive-capacitive sensors (e.g., resistive-inductive-capacitive sensors 402N-402N) may each be placed in a low-impedance state. Similarly, when a second resistive-inductive-capacitive sensor (e.g., resistive-inductive-capacitive sensor 402B) is selected by the time-division multiplexing control subsystem for being driven by V-I converter 508 and measured by the measurement circuit implemented by processing IC 512D, other resistive-inductive-capacitive sensors (e.g., resistive-inductive-capacitive sensors other than 402B, including 402A) may each be placed in a low-impedance state. Such an approach may minimize power consumption within unselected resistive-inductive-capacitive sensors 402.

A similar approach may also be used in a resonant phase sensing system having only a single resistive-inductive-capacitive sensor 402 in order to reduce power consumption associated with such sensor. For example, instead of time-division multiplexing among multiple sensors, a single resistive-inductive-capacitive sensor 402 may be duty-cycled in operation such that, for a first portion of a cycle of a measurement circuit (e.g., processing IC 512A), the measurement circuit may operate in a low power mode, and, for a second portion of the cycle of the measurement circuit, the measurement circuit may operate in a high power mode in which the measurement circuit consumes more power than in the low power mode, and wherein the measurement circuit performs measurement of the phase information and determination of the displacement of a mechanical member (e.g., mechanical member 105) during the second portion.

Although not explicitly shown, resonant phase sensing system 112B could be modified in a manner similar to that of how resonant phase sensing system 112A is shown to be modified to result in resonant phase sensing system 112D, such that resonant phase sensing system 112B could implement time-division multiplexed sensing on a plurality of resistive-inductive-capacitive sensors 402. Similarly, although not explicitly shown, resonant phase sensing system 112C could be modified in a manner similar to that of how resonant phase sensing system 112A is shown to be modified to result in resonant phase sensing system 112D, such that resonant phase sensing system 112C could implement time-division multiplexed sensing on a plurality of resistive-inductive-capacitive sensors 402.

A resistive-inductive-capacitive sensor 402 used as a virtual button typically relies on an air gap or compressible spacer between mechanical member 105 and inductive coil 202, such that mechanical member 105 may be deflected inward towards inductive coil 202 with an applied force. However, both static and dynamic changes in the distance of the gap between mechanical member 105 and inductive coil 202 may change the sensitivity of the sensor. For example, due to changes in temperature proximate to resistive-inductive-capacitive sensor 402, thermal expansion of materials making up resistive-inductive-capacitive sensor 402 may cause a change in such gap (e.g., a change in distance d). As another example, deformation of mechanical member 105 or damage (e.g., a dent) to mechanical member 105 may also cause a change in such gap (e.g., a change in distance d). In addition, as is desired to make phase measurements indicative of human interaction with mechanical member 105, mechanical interaction of a human or another object with mechanical member 105 may also cause a change in such gap (e.g., a change in distance d).

Analysis of resistive-inductive-capacitive sensor 402 may show that a quality factor Q, inductance L, and inductance shift ($\Delta L/L$) for a given displacement of mechanical member 105 are a function of the gap between mechanical member 105 and inductive coil 202. Thus, with a reduction in the gap distance between mechanical member 105 and inductive coil 202:

Sensor inductance L may decrease due to increased mutual inductance;

Inductance shift ($\Delta L/L$) sensitivity may increase for a given inflection due to improved electrical coupling between mechanical member 105 and inductive coil 202; and Quality factor Q may decrease due to reduction in sensor inductance L and an increase in the alternating current (AC) series resistance of inductive coil 202, where quality factor Q may be given by $Q=\omega L/R_S$, where $\omega$ is the angular frequency at which resistive-inductive-capacitive sensor 402 is driven, and $R_S$ is a cumulative AC series resistance and direct current (DC) resistance of inductive coil 202.

A measured phase change of resistive-inductive-capacitive sensor 402 may be a function of inductance shift ($\Delta L/L$) for a given inflection and quality factor Q.

Further, quality factor Q may also vary with temperature, due to an electrical conductivity coefficient of a conductor used to manufacture inductive coil 202. Such variance may manifest as a DC resistance that may be variable as a function of temperature. In particular, a higher sensor temperature may increase inductive coil 202 DC resistance which may reduce quality factor Q, and a lower sensor temperature may decrease inductive coil 202 DC resistance which may increase quality factor Q.

Figure 7:
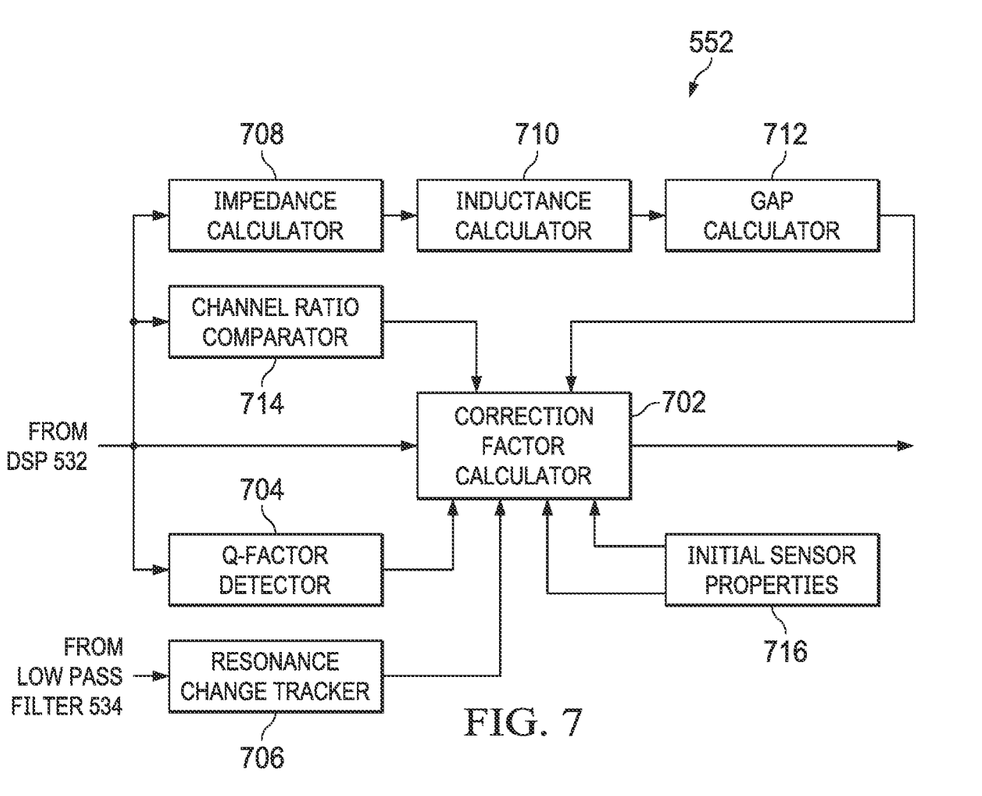
FIG. 7 illustrates a block diagram of selected components of an example compensator, in accordance with embodiments of the present disclosure.

Due to variance of quality factor Q with temperature, quality factor Q and other sensor parameters may be used to estimate a temperature associated with resistive-inductive-capacitive sensor 402. Because initial sensor parameters (e.g., initial sensor properties 716, as described below) may be stored during a calibration phase, quality factor Q and other sensor parameters can be captured at a known temperature. Even though quality factor Q may change throughout the lifetime of resistive-inductive-capacitive sensor 402 due to both air gap and temperature changes, contribution to changes in quality factor Q from each of these components may be separated. For example, because resistive-inductive-capacitive sensor 402 may be a second-order inductive-capacitive system, change in quality factor Q due to a change in air gap can be predicted by a measured change in resonance frequency $f_0$. Thus, if quality factor Q changes by more than the predicted amount for a change in resonance frequency $f_0$, then the remainder change in quality factor Q may be due to change in temperature of resistive-inductive-capacitive sensor 402. Accordingly, comparing the change in quality factor Q due to temperature to initial sensor parameters may provide the portion of the change in quality factor Q attributable to change in temperature. If a temperature conductivity coefficient of metal which makes up resistive-inductive-capacitive sensor 402 (e.g., inductive coil 202) is known, then a change in quality factor Q due to a change of series resistance of inductive coil 202 may be known. Thus, a temperature of resistive-inductive-capacitive sensor 402 may be determined regardless of air gap or any other factors that may manifest as a change in resonance frequency $f_0$.

FIG. 7 illustrates a block diagram of selected components of an example compensator 552, in accordance with embodiments of the present disclosure. As described above, compensator 552 may be configured to compensate for changes in sensor inductance L, inductance shift ($\Delta L/L$), and quality factor Q due to changes in the gap between mechanical member 105 and inductive coil 202.

As shown in FIG. 7, compensator 552 may include correction factor calculator 702, quality factor detector 704, resonance change tracker 706, impedance calculator 708, inductance calculator 710, gap calculator 712, and channel ratio comparator 714. As described in greater detail below, correction factor calculator 702 may use a change in inductance of resistive-inductive-capacitive sensor 402, change in quality factor Q of resistive-inductive-capacitive sensor 402, change in resonant frequency of resistive-inductive-capacitive sensor 402, and change in any other suitable properties of resistive-inductive-capacitive sensor 402 in comparison with initial sensor properties 716 of resistive-inductive-capacitive sensor 402 (which may be stored in a memory integral to or otherwise accessible to compensator 552) to correct for measurement sensitivity changes caused by changes in gap distance between mechanical member 105 and inductive coil 202 and/or temperature.

Quality factor detector 704 may comprise any suitable system, device, or apparatus configured to determine a quality factor for resistive-inductive-capacitive sensor 402. For example, in some embodiments, quality factor detector 704 may extract the quality factor by tracking a phase slope for resistive-inductive-capacitive sensor 402 during a change in driving frequency of resistive-inductive-capacitive sensor 402. In these and other embodiments, quality factor detector 704 may be implemented in accordance with the methods and systems disclosed in U.S. patent application Ser. No. 16/354,695 filed Mar. 15, 2019, and incorporated by reference herein in its entirety.

Resonance change tracker 706 may monitor changes to the driving frequency set by variable oscillator 516. As described herein, the feedback loop formed in part by combiner 450 and low-pass filter 434 may serve to track a resonant frequency of resistive-inductive-capacitive sensor 402 and control the driving frequency of resistive-inductive-capacitive sensor 402 which is established by oscillator 516. Accordingly, resonance change tracker 706 may monitor such resonant frequency, track changes to such resonant frequency over time, and communicate signals to correction factor calculator 702 indicative of such changes.

As described above, a memory may store initial sensor properties 716. Initial sensor properties 716 may include various properties associated with resistive-inductive-capacitive sensor 402 with mechanical member 105 in a resting state in which it is not being acted upon by a human or other mechanical stimulus. Such properties may comprise an initial quality factor $Q_{init}$, inductance $L_{init}$, resonant frequency $f_{init}$, tank capacitance $C_{init}$, and/or one or more other properties of resistive-inductive-capacitive sensor 402. Such properties may be determined during a calibration sequence of resonant phase sensing system 112 or otherwise provided to compensator 552 as default properties.

In operation, one or both of quality factor detector 704 and resonance change tracker 706 may be used to trigger calculation of a correction factor by correction factor calculator 702 in response to the existence of one or more triggering conditions. The one or more triggering conditions may include, without limitation:
  a change in resonant frequency of resistive-inductive-capacitive sensor 402 by more than a threshold amount;
  a change in quality factor Q of resistive-inductive-capacitive sensor 402 by more than a threshold amount;
  a change in resonant frequency of resistive-inductive-capacitive sensor 402 at a rate outside of a predetermined range; and
  a change in quality factor Q of resistive-inductive-capacitive sensor 402 at a rate outside of a predetermined range.

In one example scenario, if resonance change tracker 706 detects a change in resonant frequency of resistive-inductive-capacitive sensor 402 due to a deflection caused by intentional human interaction, the system time constants of resonant phase sensing system 112 may be fast enough and/or change in resonant frequency may be small enough such that no triggering of calculation of a correction factor may occur. Because only the contribution of resistive-inductive-capacitive sensor 402 to the change in resonant frequency may be desired, the change in resonant frequency may be determined by removing any on-chip effects within resonant phase sensing system 112 that may have added to the change in resonant frequency, including without limitation temperature-induced changes in resonant frequency.

For example, in some embodiments, compensator 552 may measure resonant frequency $f_{new}$ of resistive-inductive-capacitive sensor 402 and calculate a change if in the frequency by subtracting a previously-measured frequency $f_{old}$ from the measured resonant frequency $f_{new}$. Compensator 552 may further subtract undesired system frequency change effects $\Delta f_{chip}$, such as temperature-induced changes, from the measured change M, the net result being a change in frequency $\Delta f_{sensor}$ attributable solely to the change in resonance of resistive-inductive-capacitive sensor 402. With change in frequency $\Delta f_{sensor}$ known, it may be assumed that this change in resonance frequency was caused by a change in inductance $\Delta L$ of resistive-inductive-capacitive sensor 402, based on the relationship $f=1/2\pi\sqrt{(LC)}$, where C is a tank capacitance of resistive-inductive-capacitive sensor 402. While a change in tank capacitance could also manifest as a change in frequency $\Delta f_{sensor}$, capacitive changes may be relatively small as resistive-inductive-capacitive sensor 402 may be designed to measure inductance with a fixed tank capacitance C. If change in inductance $\Delta L$ is positive in value, it may indicate mechanical member 105 moving away from inductive coil 202. If change in inductance $\Delta L$ is negative in value, it may indicate mechanical member 105 moving towards inductive coil 202. By calculating change in inductance $\Delta L$ using a change in frequency $\Delta f_{sensor}$ measurement, the calculated change in inductance $\Delta L$ may be robust against absolute resonant frequency accuracy, as any unknown resonant frequency offset caused by a digital code or other control signal controlling oscillator 516 may be effectively cancelled by using the change in frequency, rather than an absolute frequency indicated by such digital code or other control signal.

Alternatively, another approach for extracting inductance L may be used. If tank capacitance C is programmed in initial sensor properties 716, and an absolute accuracy for a digital code or other control signal controlling oscillator 516, then a new sensor inductance may be found directly based on sensing of an absolute resonant frequency $f_{new}$, and not the change in frequency $\Delta f_{sensor}$.

At the time a change in frequency $\Delta f_{sensor}$ sensor is made, the quality factor detector 704 may also measure a quality factor Q of resistive-inductive-capacitive sensor 402, such that both the resonant frequency and quality factor Q are known at the same time. By measuring an aggregate quality factor Q, the measured quality factor Q may include any changes between mechanical member 105 and inductive coil 202 as well as any temperature effects. With both the change in inductance $\Delta L$ and new measured quality factor $Q_{new}$ known, such parameters may be compared to initial sensor properties 716 to find a new total inductance $L_{new}$ ($L_{new}=\Delta L+L_{init}$) for resistive-inductive-capacitive sensor 402 and a change in quality factor $\Delta Q$ ($\Delta Q=Q_{new}-Q_{init}$) Other new extracted parameters may include the change in inductance $\Delta L$ against the initial inductance value $L_{init}$ ($\Delta L/L_{init}$) and against the new inductance value $L_{new}$ ($\Delta L/L_{new}$).

Correction factor calculator 702 may compare initial sensor properties 716 and the newly-captured properties to determine appropriate compensation or correction to be applied to resonant phase sensing system 112 including compensation or correction for a signal output by resonant phase sensing system 112 indicative of a human interaction with mechanical member 105. For example, correction factor calculator 702 may apply one or more of the following compensations and corrections:

compensation such that changes in a gap between mechanical member 105 and inductive coil 202 have no effect on virtual button sensitivity for a given virtual button sensitivity;
  compensation such that changes in temperature have no effect on virtual button sensitivity for a given virtual button sensitivity; and linearization of measured phase information for incremental changes in the gap between mechanical member 105 and inductive coil 202 wherein:
    linear changes in applied sensor force yield linear detected phase output; and
    linear changes in sensor deflection yield linear detected phase output.

Such compensation and/or correction may be applied by one or more of scaling of the actual measured phase and amplitude information, modification of force detection thresholds for a virtual button, adding offsets to measured phase and amplitude information, use of digital or analog filtering, referencing a lookup table for compensation values to be applied, adjustment of resonant frequency using tuning capacitors within and/or changing resistance of resistive-inductive-capacitive sensor 402, and/or any other suitable compensation or correction. Such compensation and/or correction may be used to improve user experience for a virtual button that responds based on the amount of deflection or force applied to the virtual button, improve virtual button interaction detection algorithms by comparing sample to sample phase information, modify virtual button force detection thresholds, analyze phase versus change in deflection slope to adjust performance of key analog circuitry blocks of resonant phase sensing system to improve detection sensitivity, and/or analyze phase versus change in deflection slope to adjust performance of key analog circuitry blocks of resonant phase sensing system to compare sensitivity between multiple buttons for sensor diagnostics. Benefits of applying compensation and/or correction based on sensor gap and temperature may include resonant phase sensing-based virtual buttons that provide an opportunity for more user interaction than a traditional discrete (e.g., on or off) mechanical button, a consistent user experience across changes in sensor performance over time, and immunity of user experience from external factors.

Impedance calculator 708 may comprise any system, device, or apparatus configured to calculate an impedance of resistive-inductive-capacitive sensor 402 based on phase and/or amplitude information processed by DSP 532. Inductance calculator 710 may comprise any system, device, or apparatus configured to calculate an inductance of resistive-inductive-capacitive sensor 402 based on the calculation of impedance performed by impedance calculator 708. Gap calculator 712 may comprise any system, device, or apparatus configured to calculate a gap between mechanical member 105 and inductive coil 202 based on the calculation of inductance performed by inductance calculator 710. Example functionality of impedance calculator 708, inductance calculator 710, and gap calculator 712 is further described in greater detail below.

Inductive-capacitive tank sensors have a variable impedance versus frequency which can be simplified to the form $Z=R+jX$, where Z is impedance, R is resistance, and X is reactance. At resonance, the reactive component is cancelled, leaving just the resistive term $Z=R$. At frequencies sufficiently below resonance (e.g., 10 times below resonant frequency), inductance may dominate the reactive portion, and the impedance can be simplified to $Z=R+j\omega L$.

Accordingly, to calculate inductance of resistive-inductive-capacitive sensor 402, resonant phase sensing system 112 may sweep a range of frequencies and impedance calculator 708 may measure impedance Z versus frequency f (or angular frequency $\omega=2\pi f$). Impedance calculator 708 may further extract the imagination portion of the impedance, jX, by measuring the impedance at two different frequencies and calculating the difference. With impedance Z measured and drive frequency f known, inductance calculator 710 may calculate inductance L as $L=X/\omega$. Gap calculator 712 may include or may otherwise have access to a pre-characterized lookup table (e.g., inductance versus distance lookup table), and thus may calculate a gap between mechanical member 105 and inductive coil 202 based on the inductance calculated by inductance calculator 710.

In other embodiments, with resistive-inductive-capacitive sensor 402 being driven by a current source (e.g., V-I converter 508) and processing IC 512 measuring a voltage induced on resistive-inductive-capacitive sensor 402, another approach may be used to measure inductance L and the gap between mechanical member 105 and inductive coil 202. In such approach, impedance calculator 708 may not be present or needed, and resonant phase sensing system 112 may linearly increase a current $I_{drive}$ from a minimum current $I_{min}$ to a maximum current $I_{max}$ over a period of time $T_{ramp}$, during which period of time $T_{ramp}$ a measured voltage $V_{meas}$ of resistive-inductive-capacitive sensor 402 should remain constant. Accordingly, inductance calculator 710 may calculate inductance L as $L=V_{meas}T_{ramp}/(I_{max}-I_{min})$ In turn, gap calculator 712 may (e.g., based on a pre-characterized lookup table) calculate a gap between mechanical member 105 and inductive coil 202 based on the inductance calculated by inductance calculator 710.

In these and other embodiments, a variation in air gap may be characterized and compensated for by performing a calibration (e.g., a factory calibration) with known force levels applied. For example, during a factory calibration, a calibration tool may separately apply at least two known forces to mechanical member 105, compensator 552 may measure the phase response to such applied forces and calculate the slope of phase shift versus force, and may apply a gain correction to each resistive-inductive-capacitive sensor 402 in order to achieve the desired phase response as a function of applied force.

In these and other embodiments, in a resonant phase sensing system 112 having multiple resistive-inductive-capacitive sensors 402, compensator 552 may apply compensation for each resistive-inductive-capacitive sensor 402. For example, during factory calibration, the response of each resistive-inductive-capacitive sensor 402 may be calibrated to account for gap between mechanical member 105 and inductive coil 202. During factory calibration, compensator 552 may measure the phase response of each resistiveinductive-capacitive sensor 402 responsive to one or more known applied forces, store such phase information in a memory accessible to compensator 552, calculate ratios of phase responses between adjacent resistive-inductive-capacitive sensors 402, and store such ratios. During active use, compensator 552 may periodically measure the phase response of each resistive-inductive-capacitive sensor 402 and calculate ratios of phase responses between adjacent resistive-inductive-capacitive sensors 402. Due to aging or mechanical damage, a gap between mechanical member 105 and inductive coil 202 of one resistive-inductive-capacitive sensor 402 may vary over time to a greater extent than another resistive-inductive-capacitive sensor 402, resulting in new ratios between adjacent resistive-inductive-capacitive sensors 402. Calculation of new ratios and comparison of such new ratios to those obtained during factory calibration may be used to characterize a gap profile for a resistive-inductive-capacitive sensor 402, and compensator 552 may apply a gain correction for each resistive-inductive-capacitive sensor 402 to achieve uniform phase responses among resistive-inductive-capacitive sensors 402 and a consistent force activation threshold for each resistive-inductive-capacitive sensor 402.

Although the foregoing contemplates compensator 552 integral to processing IC 512 as measuring phase information, calculating compensation factors, and applying such compensation factors, in some embodiments, all or part of compensator 552 may be implemented within a controller (e.g., controller 103) external to processing IC 512.

Although the foregoing contemplates use of closed-loop feedback for sensing of displacement, the various embodiments represented by FIGS. 5A-5C may be modified to implement an open-loop system for sensing of displacement. In such an open-loop system, a processing IC 512 may include no feedback path from amplitude and phase calculation block 531 to oscillator 516 or variable phase shifter 519 and thus may also lack a feedback low-pass filter 534. Thus, a phase measurement may still be made by comparing a change in phase to a reference phase value, but the oscillation frequency driven by oscillator 516 may not be modified or the phase shifted by variable phase shifter 519 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 532 may be capable of processing phase information to make a binary determination of whether physical interaction associated with a human-machine interface associated with mechanical member 105 has occurred and/or ceased to occur, in some embodiments, DSP 532 may quantify a duration of a displacement of mechanical member 105 to more than one detection threshold, for example to detect different types of physical interactions (e.g., a short press of a virtual button versus a long press of the virtual button). In these and other embodiments, DSP 532 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a sensor configured to output a sensor signal indicative of a distance between the sensor and a mechanical member associated with the sensor;
   a measurement circuit communicatively coupled to the sensor and configured to determine a physical force interaction with the mechanical member based on the sensor signal; and
   a compensator configured to monitor the sensor signal and to apply a compensation factor to the sensor signal to compensate for changes to properties of the sensor based on at least one of:
      changes in a distance between the sensor and the mechanical member; and
      changes in a temperature associated with the sensor;
   wherein the compensator comprises a quality factor detector configured to monitor a quality factor of the sensor and the compensator is configured to apply the compensation factor based on the quality factor and the compensator is configured to determine a temperature associated with the sensor based on the quality factor.

2. The system of claim 1, wherein the sensor is a resistive-inductive-capacitive sensor.

3. The system of claim 2, wherein:
   the system further comprises a driver configured to drive the sensor at a driving frequency; and
   the measurement circuit is configured to:
      measure phase information associated with the sensor; and
      based on the phase information, determine a displacement of a mechanical member relative to the resistive-inductive-capacitive sensor, wherein the displacement of the mechanical member causes a change in an impedance of the resistive-inductive-capacitive sensor.

4. The system of claim 3, wherein the displacement is indicative of an interaction with a virtual button comprising the mechanical member.

5. The system of claim 4, wherein the compensator is further configured to apply the compensation factor to consistently determine interaction with the virtual button despite changes in properties of the sensor.

6. The system of claim 1, wherein the compensator is further configured to:
   determine a resonant frequency of the sensor; and
   determine a change in one or more of the distance between the sensor and the mechanical member and the temperature based on the resonant frequency.

7. The system of claim 1, wherein the compensator is further configured to:
   determine a resonant frequency of the sensor; and
   determine a change in an impedance of the sensor based on the frequency.

8. The system of claim 1, wherein the compensator is further configured to:
   determine a resonant frequency of the sensor; and
   determine a change in an inductance of the sensor based on the frequency.

9. The system of claim 1, wherein the compensator is further configured to determine a change in the distance between the sensor and the mechanical member based on the change in inductance.

10. The system of claim 1, wherein the compensator applies the compensation factor in response to one or more of:
    a change in resonant frequency of the sensor by more than a threshold frequency change;
    a change in resonant frequency of the sensor at a rate outside of a predetermined frequency rate change range;
    a change in a quality factor of the sensor by more than a threshold quality factor change; and
    a change in the quality factor of the sensor at a rate outside of a predetermined quality factor rate change range.

11. The system of claim 1, wherein the compensation factor comprises one or more of:
    scaling of measured phase information associated with the sensor;
    scaling of measured amplitude information associated with the sensor;
    modification of a detection threshold for indicating physical force interaction with the mechanical member;
    application of an offset to the sensor signal;
    application of a filter to the sensor signal;
    application of a compensation value from a lookup table; and
    modification of a resonant frequency of the sensor.

12. The system of claim 1, wherein the compensator is further configured to:
    determine impedance of the sensor as a function of frequency;
    determine a calculated inductance of the sensor based on the impedance of the sensor as a function of frequency;
    compare the calculated inductance against a predetermined inductance versus distance relationship of the sensor to determine the distance between the mechanical member and the sensor; and
    apply the compensation as a gain correction to compensate for changes in the distance.

13. The system of claim 1, wherein the compensator is further configured to:
    over a duration, linearly increase a current driven to the sensor from a minimum current to a maximum current;
    measure a voltage associated with the sensor during the duration;
    determine a calculated inductance of the sensor based on the voltage, the maximum current and the minimum current;
    compare the calculated inductance against a predetermined inductance versus distance relationship of the sensor to determine the distance between the mechanical member and the sensor; and
    apply the compensation as a gain correction to compensate for changes in the distance.

14. A method comprising, in a system comprising a sensor configured to output a sensor signal indicative of a distance between the sensor and a mechanical member associated with the sensor and a measurement circuit communicatively coupled to the sensor and configured to determine a physical force interaction with the mechanical member based on the sensor signal:
applying a compensation factor to the sensor signal to compensate for changes to properties of the sensor based on at least one of:
changes in a distance between the sensor and the mechanical member; and
changes in a temperature associated with the sensor;
monitoring a quality factor of the sensor and the compensator is configured to apply the compensation factor based on the quality factor; and
determining a temperature associated with the sensor based on the quality factor.

15. The method of claim 14, wherein the sensor is a resistive-inductive-capacitive sensor.

16. The method of claim 15, wherein:
the system further comprises a driver configured to drive the sensor at a driving frequency; and
the measurement circuit is configured to:
measure phase information associated with the sensor; and
based on the phase information, determine a displacement of a mechanical member relative to the resistive-inductive-capacitive sensor, wherein the displacement of the mechanical member causes a change in an impedance of the resistive-inductive-capacitive sensor.

17. The method of claim 16, wherein the displacement is indicative of an interaction with a virtual button comprising the mechanical member.

18. The method of claim 17, further comprising applying the compensation factor to consistently determine interaction with the virtual button despite changes in properties of the sensor.

19. The method of claim 14, further comprising:
determining a resonant frequency of the sensor; and
determining a change in one or more of the distance between the sensor and the mechanical member and the temperature based on the resonant frequency.

20. The method of claim 14, further comprising:
determining a resonant frequency of the sensor; and
determining a change in an impedance of the sensor based on the frequency.

21. The method of claim 14, further comprising:
determining a resonant frequency of the sensor; and
determining a change in an inductance of the sensor based on the frequency.

22. The method of claim 14, further comprising determining a change in the distance between the sensor and the mechanical member based on the change in inductance.

23. The method of claim 14, further comprising applying the compensation factor in response to one or more of:
a change in resonant frequency of the sensor by more than a threshold frequency change;
a change in resonant frequency of the sensor at a rate outside of a predetermined frequency rate change range;
a change in a quality factor of the sensor by more than a threshold quality factor change; and
a change in the quality factor of the sensor at a rate outside of a predetermined quality factor rate change range.

24. The method of claim 14, wherein the compensation factor comprises one or more of:
scaling of measured phase information associated with the sensor;
scaling of measured amplitude information associated with the sensor;
modification of a detection threshold for indicating physical force interaction with the mechanical member;
application of an offset to the sensor signal;
application of a filter to the sensor signal;
application of a compensation value from a lookup table; and
modification of a resonant frequency of the sensor.

25. The method of claim 14, further comprising:
determining impedance of the sensor as a function of frequency;
determining a calculated inductance of the sensor based on the impedance of the sensor as a function of frequency;
comparing the calculated inductance against a predetermined inductance versus distance relationship of the sensor to determine the distance between the mechanical member and the sensor; and
applying the compensation as a gain correction to compensate for changes in the distance.

26. The method of claim 14, further comprising:
over a duration, linearly increasing a current driven to the sensor from a minimum current to a maximum current;
measuring a voltage associated with the sensor during the duration;
determining a calculated inductance of the sensor based on the voltage, the maximum current and the minimum current;
comparing the calculated inductance against a predetermined inductance versus distance relationship of the sensor to determine the distance between the mechanical member and the sensor; and
applying the compensation as a gain correction to compensate for changes in the distance.

* * * * *